(12) United States Patent
Su et al.

(10) Patent No.: US 8,390,102 B2
(45) Date of Patent: Mar. 5, 2013

(54) OPTOISOLATOR LEADFRAME ASSEMBLY

(75) Inventors: Cheng-Hong Su, Taipei (TW);
Chih-Hung Tzeng, Taipei (TW)

(73) Assignees: Silitek Electronic (Guangzhou) Co., Ltd., Guangzhou (CN); Lite-On Technology Corp., Taipei (TW)

( * ) Notice: Subject to any disclaimer, the term of this patent is extended or adjusted under 35 U.S.C. 154(b) by 1292 days.

(21) Appl. No.: 12/153,543

(22) Filed: May 21, 2008

(65) Prior Publication Data

US 2009/0152002 A1    Jun. 18, 2009

(30) Foreign Application Priority Data

Dec. 13, 2007    (CN) .......................... 2007 1 0032617

(51) Int. Cl.
*H01L 33/00*    (2010.01)
*H01L 31/0203*  (2006.01)
*H01L 23/495*   (2006.01)

(52) U.S. Cl. .... 257/666; 257/99; 257/433; 257/E33.066

(58) Field of Classification Search .................... 257/99, 257/433, 666, E33.066
See application file for complete search history.

(56) References Cited

U.S. PATENT DOCUMENTS

| 3,808,673 | A | * | 5/1974 | Bottini | ............................ | 438/25 |
| 3,839,782 | A | * | 10/1974 | Lincoln | ........................... | 438/25 |
| 4,633,582 | A | * | 1/1987 | Ching et al. | ................... | 29/827 |
| 5,631,192 | A | * | 5/1997 | Heppler et al. | ................ | 438/25 |
| 7,312,516 | B2 | * | 12/2007 | Corisis | ......................... | 257/676 |
| 7,547,960 | B2 | | 6/2009 | Lee et al. | | |
| 7,576,418 | B2 | * | 8/2009 | Chen et al. | .................... | 257/670 |
| 2003/0132512 | A1 | * | 7/2003 | Yasuda et al. | ................ | 257/672 |
| 2007/0257342 | A1 | * | 11/2007 | Lee et al. | ..................... | 257/666 |

FOREIGN PATENT DOCUMENTS

| JP | 05327006 A | * | 12/1993 |
| JP | 2003133498 A | * | 5/2003 |
| TW | 200743201 | | 5/2006 |

* cited by examiner

*Primary Examiner* — Teresa M Arroyo
(74) *Attorney, Agent, or Firm* — Rosenberg, Klein & Lee (57) ABSTRACT

An optoisolator leadframe assembly includes: an emitter leadframe part including a first rail and a plurality of emitter leadframe units, each rail including two rows of emitter leadframes, each having a die-mounting pad; and a receiver leadframe part including a second rail and a plurality of receiver leadframe units, each including two rows of receiver leadframes, each having a die-mounting pad. The die-mounting pads of the emitter leadframes of each row of each of the emitter leadframe units are respectively aligned with and spaced apart from the die-mounting pads of the receiver leadframes of an adjacent row of an adjacent one of the receiver leadframe units. Each of the emitter and receiver leadframe parts is a single piece.

12 Claims, 9 Drawing Sheets

OPTOISOLATOR LEADFRAME ASSEMBLY

CROSS-REFERENCE TO RELATED APPLICATION

This application claims priority of China application no. 200710032617.1, filed on Dec. 13, 2007.

BACKGROUND OF THE INVENTION

1. Field of the Invention

This invention relates to an optoisolator leadframe assembly, more particularly to an optoisolator leadframe assembly including two aligned single pieces of emitter and receiver leadframe parts, each of which includes a rail and a plurality of leadframe units.

2. Description of the Related Art

Figure 1:
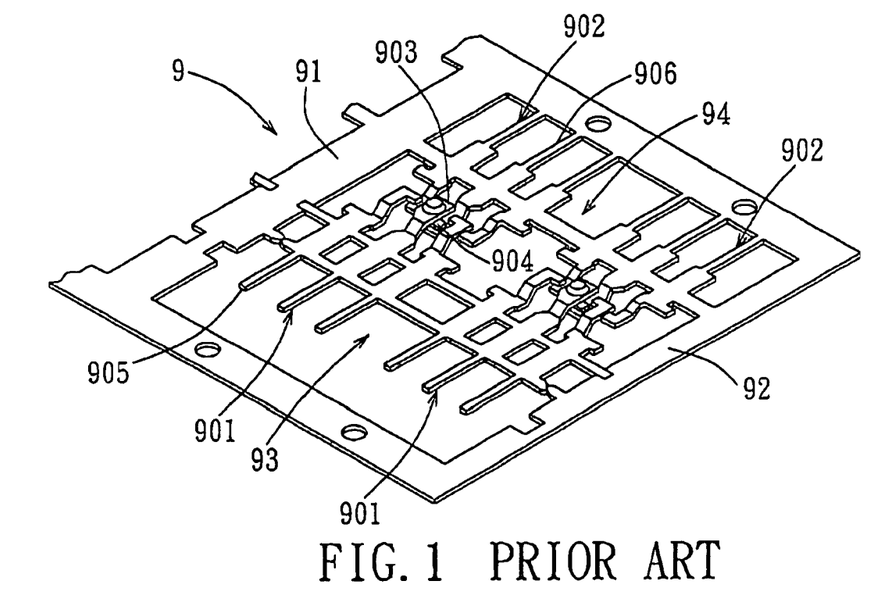
FIG. 1 is a fragmentary perspective view of a conventional optoisolator leadframe assembly.

U.S. Pat. No. 4,633,582 discloses a conventional optoisolator leadframe assembly (see FIG. 1) that is made from a single piece of a stamped metal sheet 9 including first and second rails 91, 92 that are coplanar, and emitter and receiver leadframe units 93, 94 extending between the first and second rails 91, 92 and including emitter and receiver leadframes 901, 902, respectively. Each of the emitter and receiver leadframes 901, 902 has a die-mounting pad 903 (904) for receiving one of a light emitting chip and a light detector (not shown), and a plurality of leads 905 (906). The die-mounting pad 903 of each of the emitter leadframes 901 is aligned with the die-mounting pad 904 of a corresponding one of the receiver leadframes 902. The aforesaid conventional optoisolator leadframe assembly is disadvantageous in that an additional apparatus is required to conduct twisting action of the emitter leadframe unit 93 so as to permit alignment of the die-mounting pads 903, 904 of an adjacent pair of the emitter and receiver leadframes 901, 902.

Figure 2:
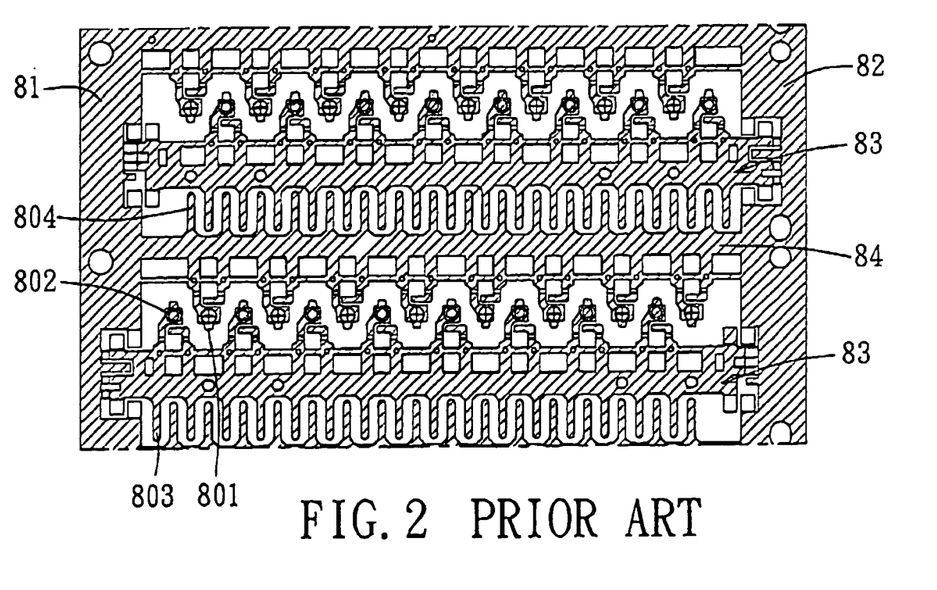
FIG. 2 is a fragmentary schematic view of another conventional optoisolator leadframe assembly.

Taiwanese Laid Open publication No. 200743201 discloses another conventional optoisolator leadframe assembly (see FIG. 2) that includes first and second rails 81, 82 that are coplanar, a plurality of emitter leadframe units 83 extending between the first and second rails 81, 82, and a plurality of receiver leadframe units 84 disposed alternately with the emitter leadframe units 83. Each of the emitter and receiver leadframe units 83, 84 has a die-mounting pad 801 (802) and a pair of leads 803 (804). The first and second rails 81, 82 and the emitter leadframe units 83 are a single piece of a stamped metal sheet. Each of the receiver leadframe units 84 is cut and removed from the single piece of the stamped metal sheet, and is then reversed and repositioned accurately between an adjacent pair of the emitter leadframe units 83, which requires an additional apparatus to conduct the reversing and repositioning actions, which, in turn, results in an increase in the manufacturing costs.

SUMMARY OF THE INVENTION

Therefore, an object of the present invention is to provide an optoisolator leadframe assembly that can overcome the aforesaid drawbacks associated with the prior art.

According to this invention, an optoisolator leadframe assembly comprises: an emitter leadframe part including a first rail extending in a first direction, and a plurality of spaced apart emitter leadframe units aligned in the first direction, each of the emitter leadframe units extending from the first rail in a second direction perpendicular to the first direction, and including at least one row of emitter leadframes, the emitter leadframes of each of the emitter leadframe units being aligned in the second direction, each of the emitter leadframes having a die-mounting pad and a pair of leads; and a receiver leadframe part including a second rail parallel to the first rail, and a plurality of spaced apart receiver leadframe units aligned in the first direction and disposed alternately with the emitter leadframe units. Each of the receiver leadframe units extends from the second rail in the second direction, and includes at least one row of receiver leadframes. The receiver leadframes of each of the receiver leadframe units is aligned in the second direction. Each of the receiver leadframes has a die-mounting pad and a pair of leads. The die-mounting pads of the emitter leadframes of each of the emitter leadframe units are respectively aligned with and spaced apart from the die-mounting pads of the receiver leadframes of an adjacent one of the receiver leadframe units in a third direction perpendicular to the first and second directions. Each of the emitter and receiver leadframe parts is a single piece. Each of the emitter leadframe units further includes a free end portion that is connected to an endmost one of the emitter leadframes and that is in contact with the second rail. Each of the receiver leadframe units further includes a free end portion that is connected to an endmost one of the receiver leadframes and that is in contact with the first rail.

The free end portion of each of the emitter leadframe units is anchored on the second rail, and the first rail seated on the free end portions of the receiver leadframe units.

The first and second rails are non-coplanar.

Each of the emitter leadframe units further includes a first stem that is connected to the other endmost one of the emitter leadframes, and that cooperates with the first rail to define a first step therebetween.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Before the present invention is described in greater detail with reference to the accompanying preferred embodiments, it should be noted herein that like elements are denoted by the same reference numerals throughout the disclosure.

Figure 3:
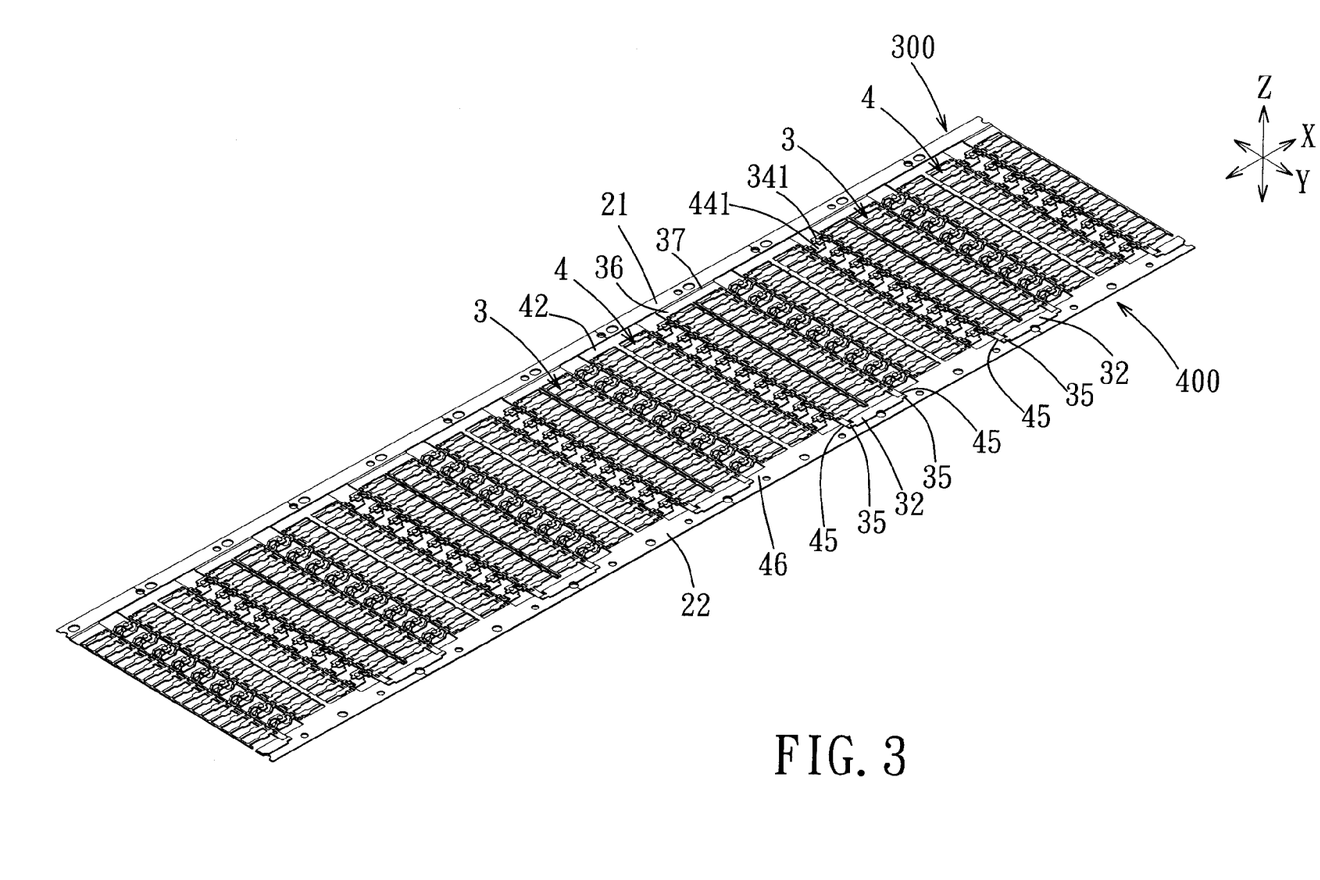
FIG. 3 is a fragmentary perspective view of the first preferred embodiment of an optoisolator leadframe assembly according to this invention.
Figure 3A:
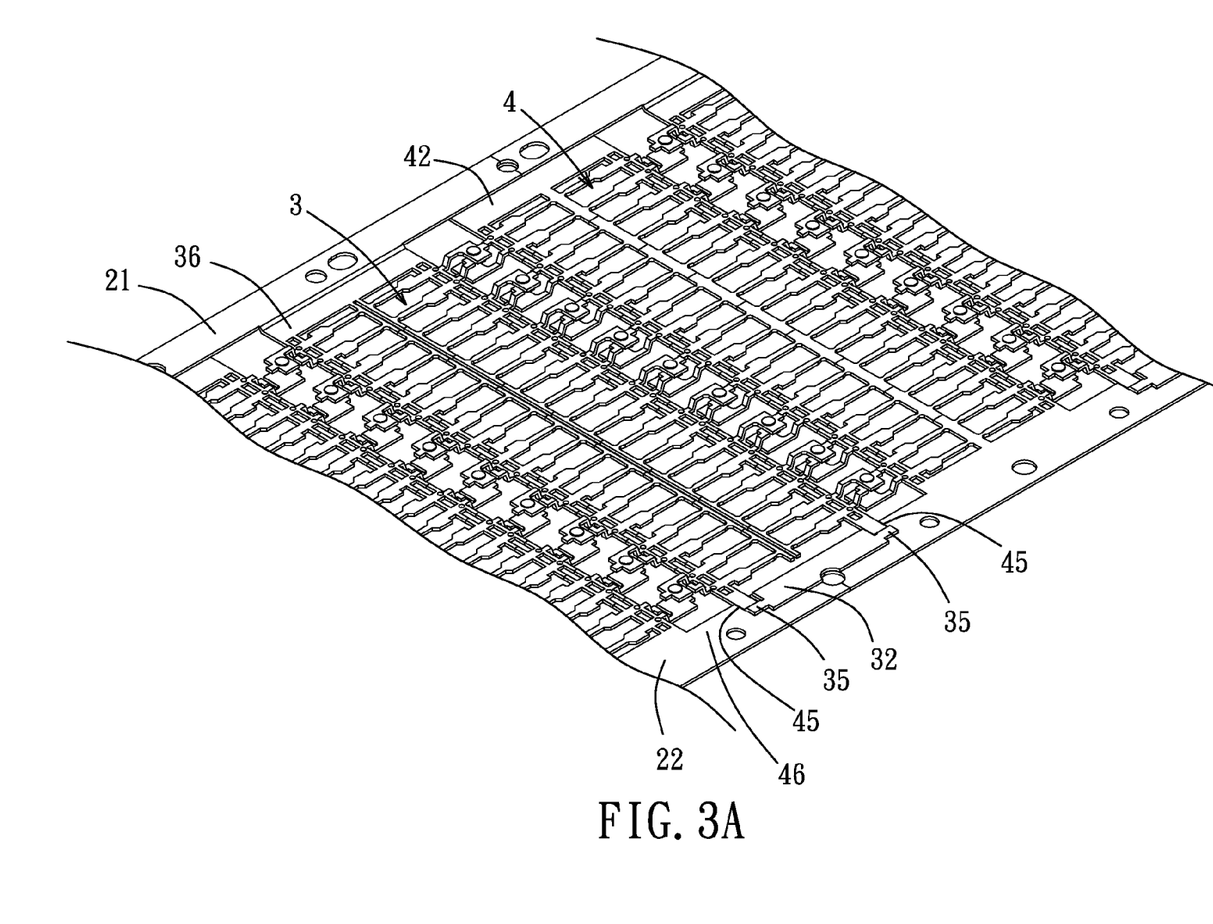
FIG. 3A is an expanded view of FIG. 3.

FIGS. 3 and 3A illustrate the first preferred embodiment of an optoisolator leadframe assembly according to the present invention. The optoisolator leadframe assembly includes: an emitter leadframe part 300 including a first rail 21 extending in a first direction (X), and a plurality of spaced apart emitter leadframe units 3 aligned in the first direction (X), each of the emitter leadframe units 3 extending from the first rail 21 in a second direction (Y) perpendicular to the first direction (X), and including two rows 33 of emitter leadframes 34 that are symmetrically disposed (see FIG. 5), each one of the two rows 33 of the emitter leadframes 34 being aligned in the second direction (Y), each of the emitter leadframes 34 having a die-mounting pad 341 and a pair of leads 342; and a receiver leadframe part 400 including a second rail 22 parallel to the first rail 21, and a plurality of spaced is apart receiver leadframe units 4 aligned in the first direction (X) and disposed alternately with the emitter leadframe units 3. Each of the receiver leadframe units 4 extends from the second rail 22 in the second direction (Y), and includes two rows 43 of receiver leadframes 44 that are symmetrically disposed (see FIG. 5). Each one of the two rows 43 of the receiver leadframes 44 is aligned in the second direction (Y). Each of the receiver leadframes 44 has a die-mounting pad 441 and a pair of leads 442. The die-mounting pad 341 of the emitter leadframes 34 of each of the two rows 33 of each of the emitter leadframe units 3 are respectively aligned with and spaced apart from the die-mounting pads 441 of the receiver leadframes 44 of an adjacent one of the two rows 43 of an adjacent one of the receiver leadframe units 4 in a third direction (Z) perpendicular to the first and second directions (X, Y). The first and second rails 21, 22 are non-coplanar, i.e., the first and second rails 21, 22 do not lie in the same plane.

Figure 4:
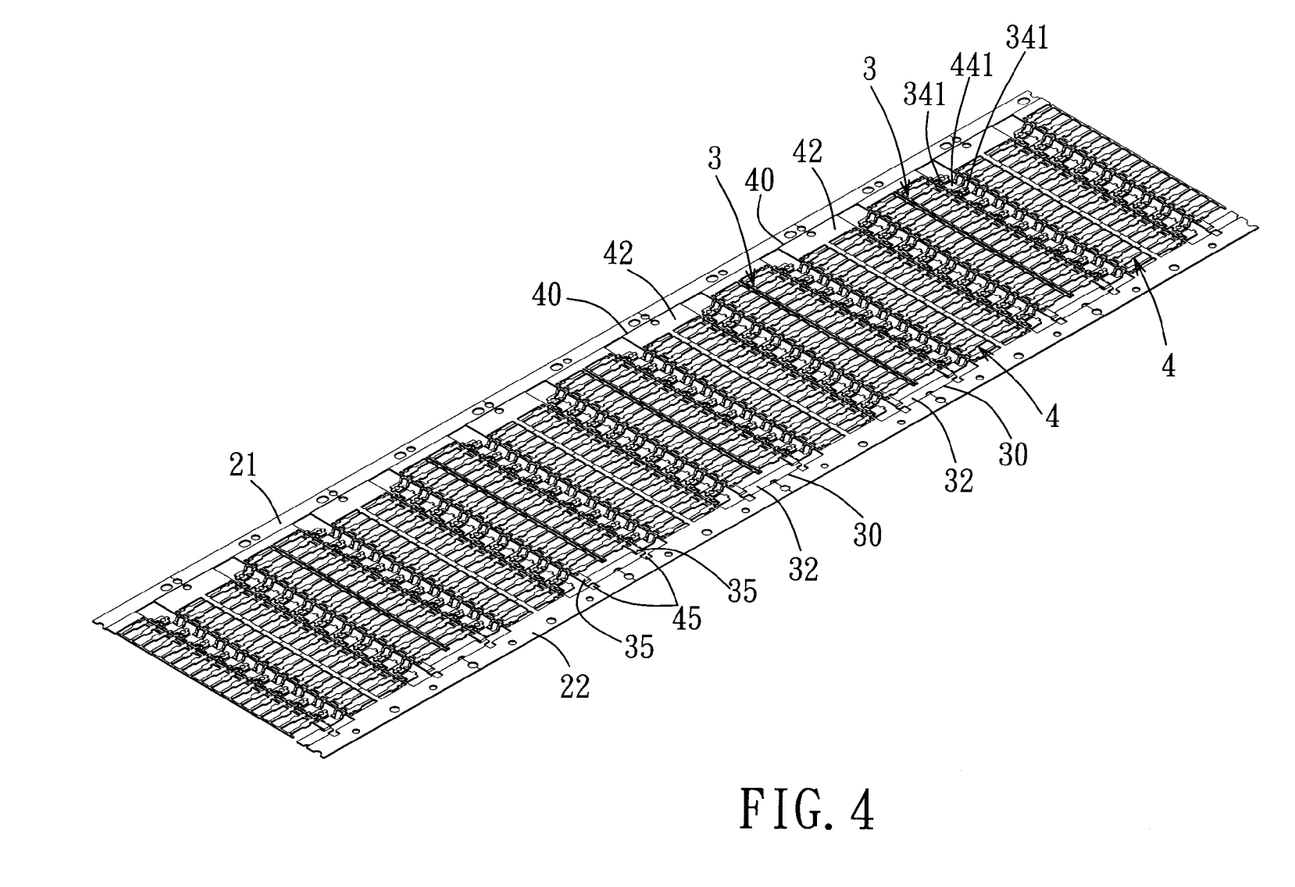
FIG. 4 is a fragmentary perspective view illustrating configurations of two single pieces cut from a stamped metal sheet for making the first preferred embodiment.
Figure 4A:
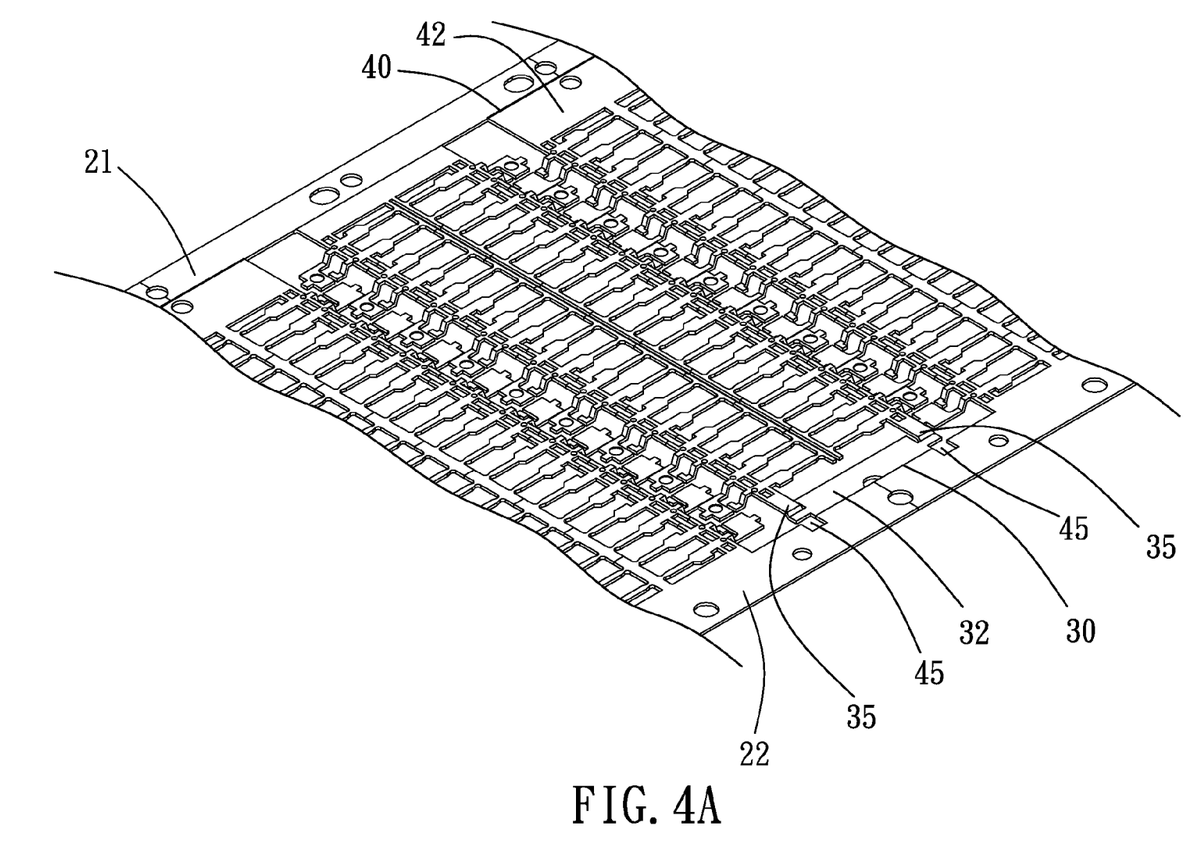
FIG. 4A is an expanded view of FIG. 4.

Each of the emitter and receiver leadframe parts 300, 400 is made from a single piece of a stamped metal sheet. During stamping operation, a first cutting slit 30 (see FIGS. 4 and 4A) is formed between the second rail 22 and each of the emitter leadframe units 3, and a second cutting slit 40 (see FIGS. 4 and 4A) is formed between the first rail 21 and each of the receiver leadframe units 4 on the stamped metal sheet, thereby permitting separation of the emitter and receiver leadframe parts 300, 400 (see FIG. 5). The emitter and receiver leadframe parts 300, 400 are subsequently aligned (see FIG. 6) and assembled into the configuration shown in FIGS. 3 and 3A.

Figure 5:
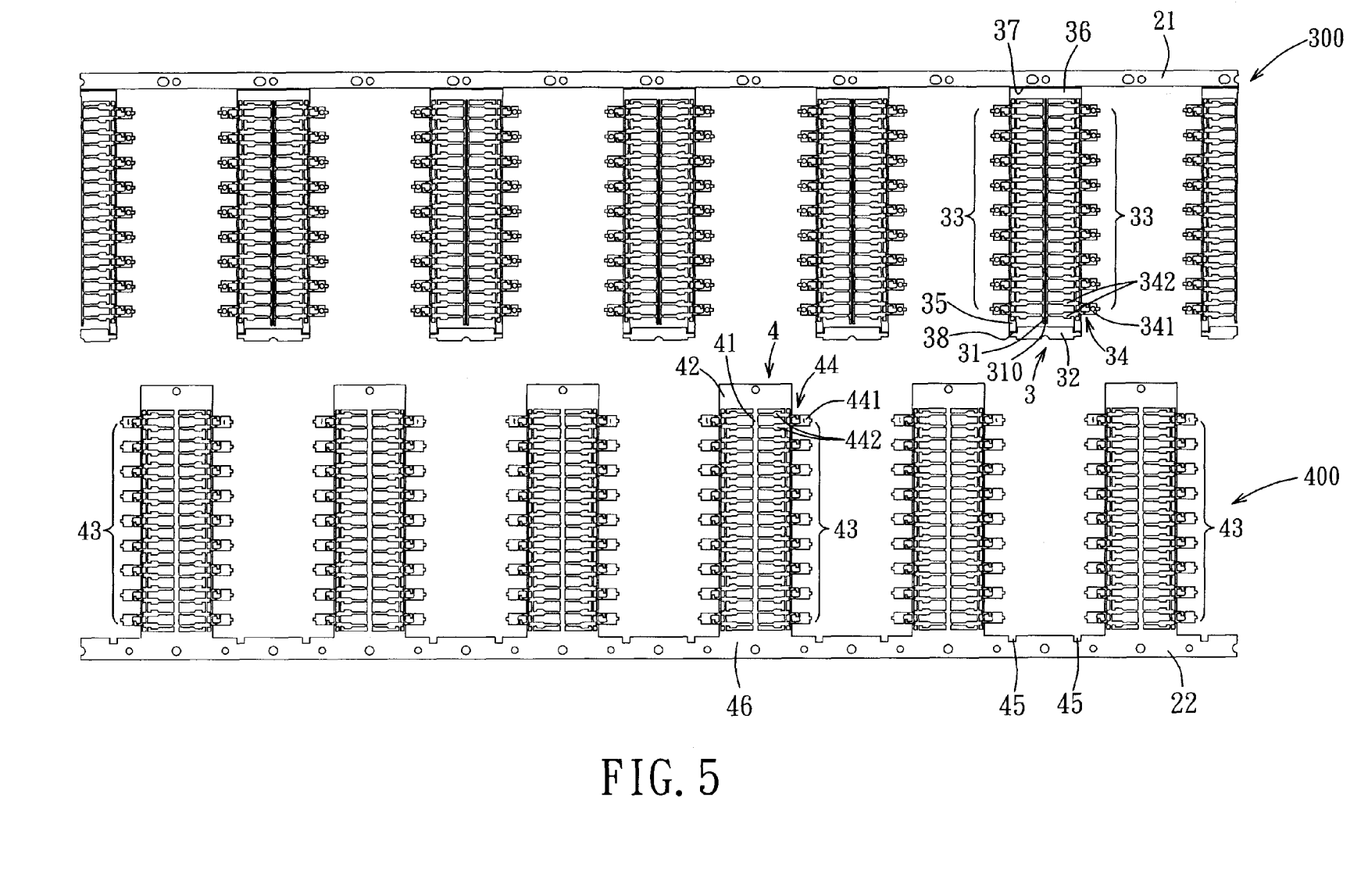
FIG. 5 is a fragmentary schematic view illustrating the configurations of the two single pieces of FIG. 4 in a separated state.

Referring to FIGS. 3 and 5, in this embodiment, each of the emitter leadframe units 3 further includes a first stem 36 that is connected to an endmost one of the emitter leadframes 34 of each of the two rows 33 of the emitter leadframe unit 3, and that cooperates with the first rail 21 to define a first step 37 therebetween. Each of the emitter leadframe units 3 further includes a free end portion 32 that is connected to the other endmost one of the emitter leadframes 34, and that is in contact with and is preferably anchored on the second rail 22. Each of the receiver leadframe units 4 further includes a second stem 46 that is connected to an endmost one of the receiver leadframes 44 of each of the two rows 43 of the receiver leadframe unit 4, and a free end portion 42 that is connected to the other endmost one of the receiver leadframes 44 and that is in contact with the first rails 21. The first rail 21 is preferably seated on the free end portions 42 of the receiver leadframe units 4.

Figure 6:
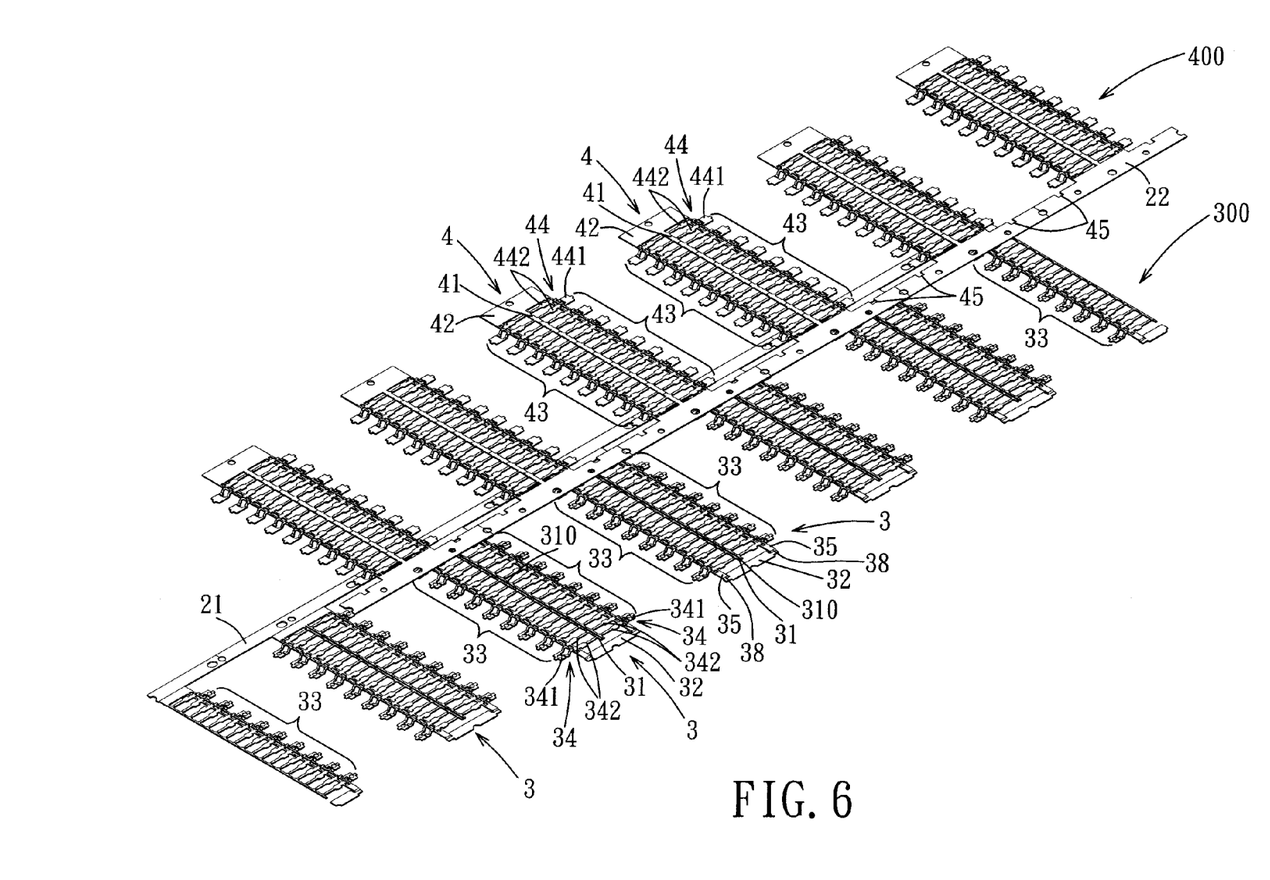
FIG. 6 is a fragmentary perspective view illustrating how the two single pieces of FIG. 4 are aligned and assembled into the optoisolator leadframe assembly of FIG. 3.

Referring now to FIG. 6, in combination with FIGS. 3 and 5, each of the emitter leadframe units 3 further includes a pair of prongs 35, each of which is disposed between and is connected to the free end portion 32 and the other endmost one of the emitter leadframes 34 of a respective one of the two rows 33 of the emitter leadframe unit 3 and each of which cooperates with the free end portion 32 to define a second step 38 therebetween. The first and second steps 37, 38 of each of the emitter leadframe units 3 have the same level so as to permit the first rail 21 and the free end portions 32 of the emitter leadframe units 3 to be coplanar. The second rail 22 is formed with a pair of retaining notches 45 between each two adjacent ones of the receiver leadframe units 4 for receiving the prongs 35 of a respective one of the emitter leadframe units 3 therein, respectively.

In this embodiment, each of the emitter leadframe units 3 further includes a central beam 31 (see FIG. 5) disposed between the two rows 33 of the emitter leadframes 34 and connected to the leads 342 of the emitter leadframes 34 of the two rows 33 of the emitter leadframe unit 3. The central beam 31 of each of the emitter leadframe units 3 is formed with a slit 310 for facilitating subsequent cutting operation. Each of the receiver leadframe units 4 further includes a central beam 41 disposed between the two rows 43 of the receiver leadframes 44 and connected to the leads 442 of the receiver leadframes 44 of the two rows 43 of the receiver leadframe unit 4.

Figure 7:
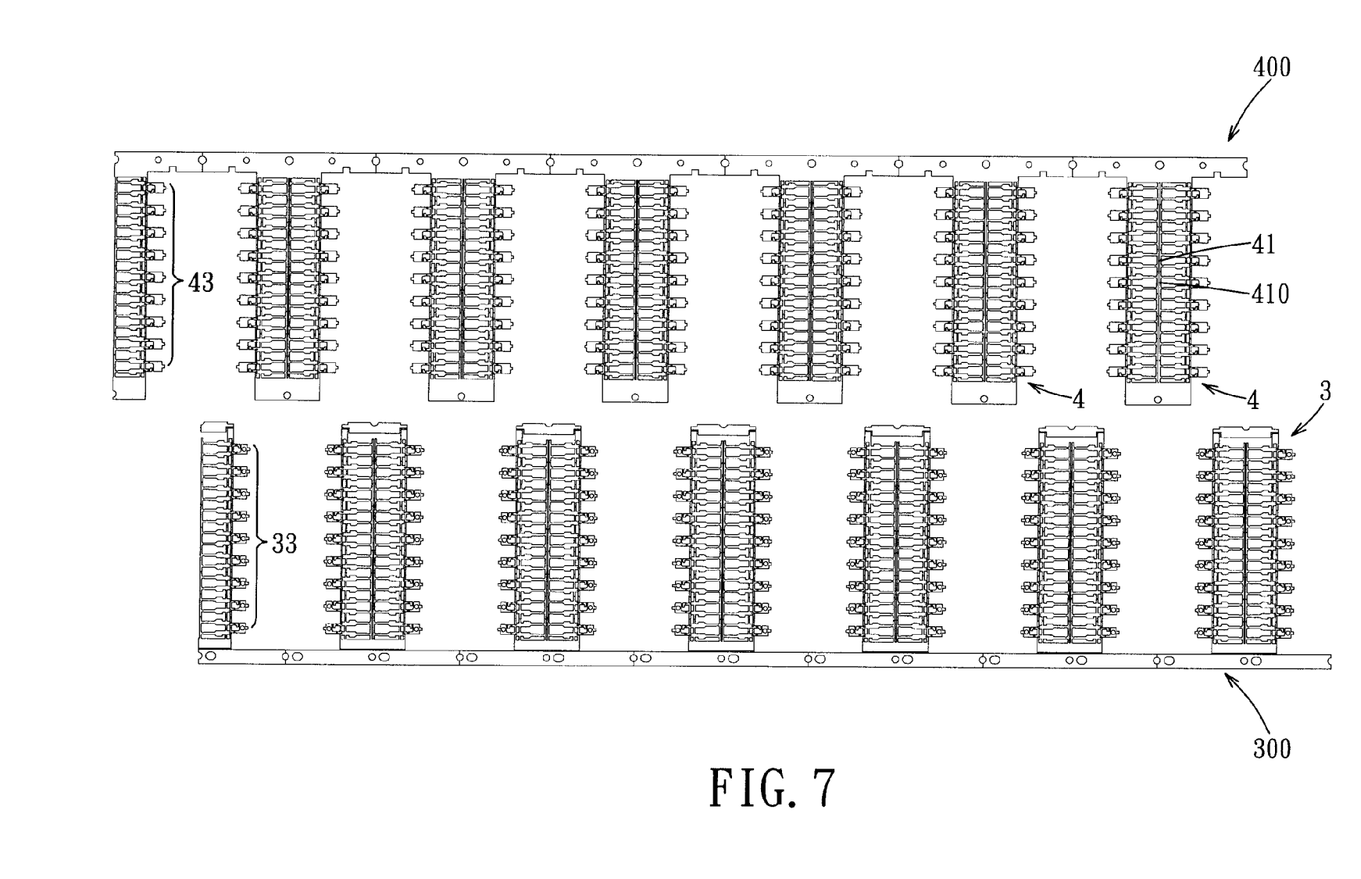
FIG. 7 is a fragmentary schematic view of the second preferred embodiment of the optoisolator leadframe assembly according to this invention.

FIG. 7 illustrates the second preferred embodiment of the optoisolator leadframe assembly according to this invention. The second preferred embodiment differs from is the previous embodiment in that the central beam 41 of each of the receiver leadframe units 4 is also formed with a slit 410 for facilitating subsequent cutting operation.

Figure 8:
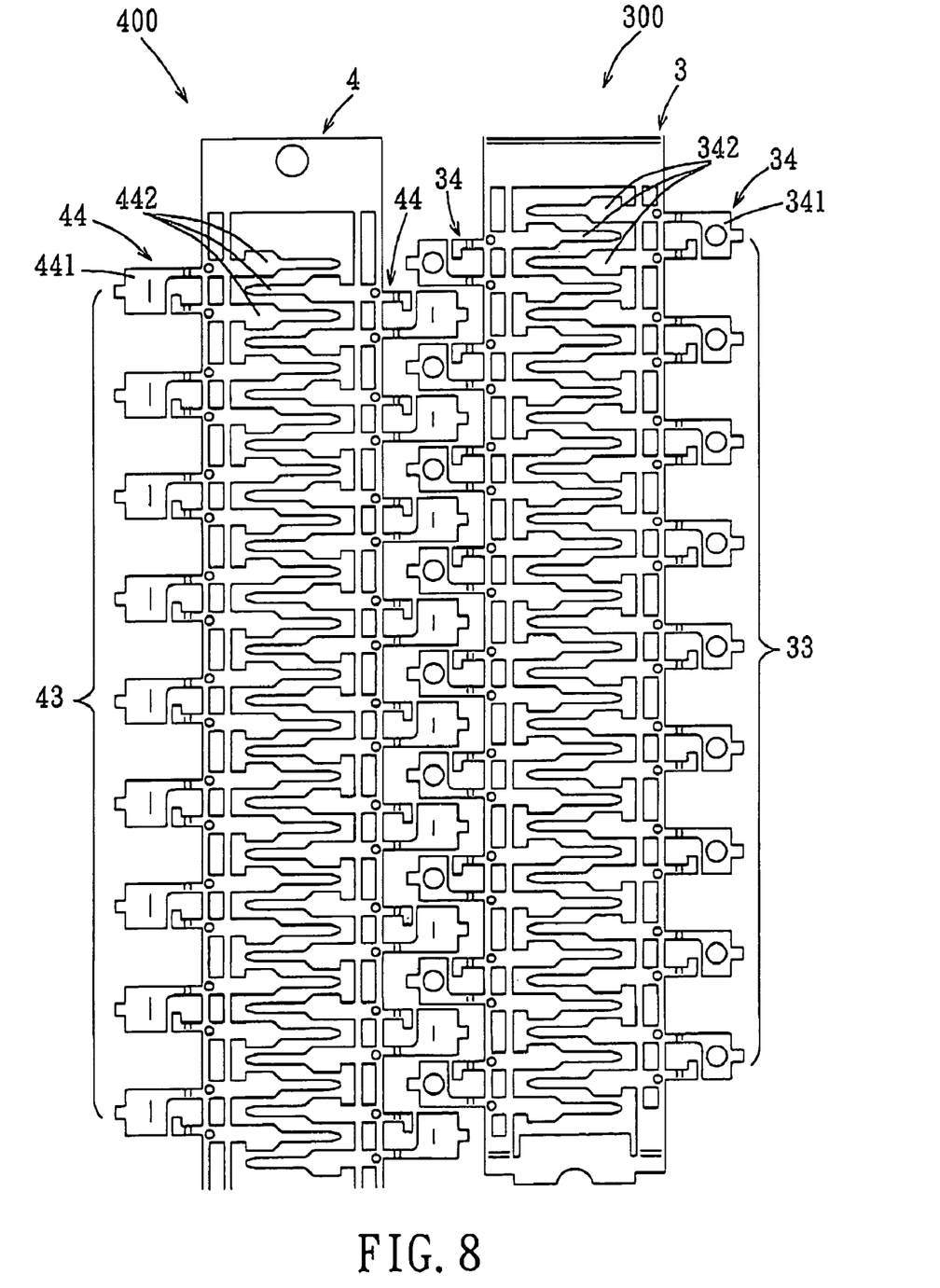
FIG. 8 is a fragmentary schematic view of the third preferred embodiment of the optoisolator leadframe assembly according to this invention.

FIG. 8 illustrates the third preferred embodiment of the optoisolator leadframe assembly according to this invention. The third preferred embodiment differs from the previous embodiments in that the central beams 31, 41 of the emitter and receiver leadframe units 3, 4 are dispensed with, that the leads 342 of the emitter leadframes 34 of one of the two rows 33 of each of the emitter leadframe units 3 are disposed alternately with the leads 342 of the emitter leadframes 34 of the other of the two rows 33 of the emitter leadframe unit 3, and that the leads 442 of the receiver leadframes 44 of one of the two rows 43 of each of the receiver leadframe units 4 are disposed alternately with the leads 442 of the receiver leadframes 44 of the other of the two rows 43 of the receiver leadframe unit 4.

With the design of the emitter and receiver leadframe parts 300, 400 of the optoisolator leadframe assembly of this invention, alignment and assembly of the emitter and receiver leadframe parts 300, 400 can be conducted using the same apparatus used to form and process the stamped metal sheet, thereby eliminating the aforesaid drawbacks associated with the prior art.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. An optoisolator leadframe assembly comprising:
   an integrally formed emitter leadframe part including:
      a first rail extending in a first direction, and
      a plurality of spaced apart emitter leadframe units aligned in the first direction, each of said emitter leadframe units extending from said first rail in a second direction perpendicular to the first direction, and including at least one row of emitter leadframes that are interconnected in series along the second direction, said emitter leadframes of each of said emitter leadframe units being aligned in the second direction, each of said emitter leadframes having a die-mounting pad and a pair of leads that are electrically connected to said die-mounting pad; and an integrally formed receiver leadframe part including:
a second rail parallel to said first rail, and
a plurality of spaced apart receiver leadframe units aligned in the first direction and disposed alternately with said emitter leadframe units, each of said receiver leadframe units extending from said second rail in the second direction, and including at least one row of receiver leadframes that are interconnected in series along the second direction, said receiver leadframes of each of said receiver leadframe units being aligned in the second direction, each of said receiver leadframes having a die-mounting pad and a pair of leads that are electrically connected to said die-mounting pad;

wherein said die-mounting pads of said emitter leadframes of each of said emitter leadframe units are respectively aligned with and spaced apart from said die-mounting pads of said receiver leadframes of an adjacent one of said receiver leadframe units in a third direction perpendicular to the first and second directions;

wherein each of said emitter leadframe units initially includes a free end portion that is connected to an endmost one of said emitter leadframes along the second direction opposite said first rail and that is configured to be and is in overlapping contact with said second rail; and wherein each of said receiver leadframe units initially includes a free end portion that is connected to an endmost one of said receiver leadframes along the second direction opposite said second rail and that is configured to be and is in overlapping contact with said first rail.

2. The optoisolator leadframe assembly of claim 1, wherein said first and second rails are non-coplanar.

3. The optoisolator leadframe assembly of claim 1, wherein said free end portion of each of said emitter leadframe units is anchored on said second rail, said first rail being seated on said free end portions of said receiver leadframe units.

4. The optoisolator leadframe assembly of claim 1, wherein each of said emitter leadframe units further includes a first stem that is connected to one of said emitter leadframes which is distal from said endmost one of said emitter leadframes, and that is electrically connected to and together with said first rail to define a first step therebetween in said third direction.

5. The optoisolator leadframe assembly of claim 1, wherein each of said receiver leadframe units further includes a second stem that is connected to one of said receiver leadframes which is distal from said endmost one of said receiver leadframes.

6. The optoisolator leadframe assembly of claim 4, wherein each of said emitter leadframe units further includes a pair of prongs, each of which is disposed between and is connected to said free end portion and said endmost one of said emitter leadframes and each of which cooperates with said free end portion to define a second step therebetween, said first and second steps of each of said emitter leadframe units having the same level so as to permit said first rail and said free end portions of said emitter leadframe units to be coplanar, said second rail being formed with a pair of retaining notches between each two adjacent ones of said receiver leadframe units for receiving said prongs of a respective one of said emitter leadframe units therein, respectively.

7. The optoisolator leadframe assembly of claim 1, wherein each of said emitter leadframe units includes two rows of said emitter leadframes that are symmetrically disposed, and each of said receiver leadframe units includes two rows of said receiver leadframes that are symmetrically disposed.

8. The optoisolator leadframe assembly of claim 7, wherein each of said emitter leadframe units further includes a central beam disposed between said two rows of said emitter leadframes and connected to said leads of said emitter leadframes.

9. The optoisolator leadframe assembly of claim 8, wherein said central beam of each of said emitter leadframe units is formed with a slit along said second direction.

10. The optoisolator leadframe assembly of claim 7, wherein each of said receiver leadframe units further includes a central beam disposed between said two rows of said receiver leadframes and connected to said leads of said receiver leadframes.

11. The optoisolator leadframe assembly of claim 10, wherein said central beam of each of said receiver leadframe units is formed with a slit.

12. The optoisolator leadframe assembly of claim 7, wherein said leads of said emitter leadframes of one of said two rows of each of said emitter leadframe units are disposed alternately with said leads of said emitter leadframes of the other of said two rows, and said leads of said receiver leadframes of one of said two rows of each of said receiver leadframe units are disposed alternately with said leads of said receiver leadframes of the other of said two rows.

* * * * *